US008238080B2

(12) United States Patent
McGinn (10) Patent No.: US 8,238,080 B2
(45) Date of Patent: Aug. 7, 2012

(54) SCALABLE, REDUNDANT POWER DISTRIBUTION FOR STORAGE RACKS (75) Inventor: Garth J. McGinn, Bel Aire, KS (US)

(73) Assignee: Netapp, Inc., Sunnyvale, CA (US)

( * ) Notice: Subject to any disclaimer, the term of this patent is extended or adjusted under 35 U.S.C. 154(b) by 114 days.

(21) Appl. No.: 12/838,838

(22) Filed: Jul. 19, 2010

(65) Prior Publication Data
US 2012/0014040 A1 Jan. 19, 2012

(51) Int. Cl.
H02B 1/04 (2006.01)
G06F 1/16 (2006.01)

(52) U.S. Cl. ........ 361/601; 361/622; 361/624; 361/625; 361/641; 361/642; 361/648; 307/14; 307/34; 307/39; 307/41; 307/112

(58) Field of Classification Search .............. 361/62–64, 361/111, 118, 600–603, 622–627, 642–648, 361/656, 727, 833, 856; 307/39, 112, 10.1, 307/11, 12, 29, 150, 38, 41, 115, 125, 126, 307/141.4, 143, 141; 340/635, 638, 664, 340/538, 656, 657, 660; 174/494, 59, 50, 174/48; 439/100, 110, 116–119
See application file for complete search history.

(56) References Cited

U.S. PATENT DOCUMENTS

| | | | | |
|---|---|---|---|---|
| 5,923,103 A * | 7/1999 | Pulizzi et al. | | 307/126 |
| 6,628,009 B1 * | 9/2003 | Chapel | | 307/14 |
| 6,826,036 B2 * | 11/2004 | Pereira | | 361/624 |
| 6,882,530 B2 * | 4/2005 | Cyphers et al. | | 361/829 |
| 7,087,840 B2 * | 8/2006 | Herring et al. | | 174/101 |
| 7,215,535 B2 * | 5/2007 | Pereira | | 361/624 |
| 7,457,106 B2 * | 11/2008 | Ewing et al. | | 361/623 |
| 7,675,739 B2 * | 3/2010 | Ewing et al. | | 361/623 |
| 7,675,740 B2 | 3/2010 | Rasmussen et al. | | |
| 7,718,889 B2 * | 5/2010 | Rasmussen et al. | | 174/50 |
| 7,891,993 B2 * | 2/2011 | Huber et al. | | 439/110 |
| 7,982,335 B2 * | 7/2011 | Aldag et al. | | 307/12 |
| 2008/0093927 A1 * | 4/2008 | Ewing et al. | | 307/23 |
| 2009/0242265 A1 * | 10/2009 | Doorhy et al. | | 174/494 |

OTHER PUBLICATIONS

RD502034A, Feb. 2006, Grisham et al.*
"Rack Power Distribution Unit for Critical IT Equipment—One Move Ahead With Emerson Network Power;" Emerson Electric, 2009 (specific date unknown).

* cited by examiner

Primary Examiner — Michail V Datskovskiy
(74) Attorney, Agent, or Firm — Haynes and Boone, LLP (57) ABSTRACT Disclosed is a power distribution module that is capable of providing power to rack mounted equipment modules in electronic equipment mounting racks. The power distribution module may comprise a series of individual modules that can be placed at strategic locations through the electronic equipment mounting rack to meet the specific power requirements of the rack mounted equipment modules, which may vary depending upon the type of module. In this manner, the expense of supplying power of a particular amount to a specific location can be reduced. In addition, power distribution modules are disclosed that are prefabricated in different versions to meet the power requirements of the design of the electronic equipment mounting rack.

11 Claims, 10 Drawing Sheets

SCALABLE, REDUNDANT POWER DISTRIBUTION FOR STORAGE RACKS

BACKGROUND

Power delivery and distribution in electronic equipment mounting racks may be provided by IEC connectors that are defined by the International Electrotechnical Commission in IEC specification 60320, and NEMA connectors that are defined by the U.S. National Electrical Manufacturers' Association. IEC C14 female receptacles comprise a three conductor connector to which a C13 plug of a power cord can be inserted. Electronic modules, such as servers, RAID storage devices, or any type of desired electronic module, may use a C14 panel mounted male conductor that a C13 cable can engage. For higher current applications, C20 receptacles can be used with C19 cables.

Power requirements for electronic equipment mounting racks may vary according to the power requirements of the electronic modules that are placed in the racks. Providing the correct power requirements is integral to the proper operation of the modules within the rack.

SUMMARY

An embodiment of the present invention may therefore comprise a method of providing power to rack mounted equipment modules in an electronic equipment mounting rack comprising: calculating power requirements at specific rack unit locations in the electronic equipment mounting rack based upon power requirements of the rack mounted equipment modules that are disposed at the specific rack unit locations; constructing a power distribution unit having a length of approximately eight rack units, the power distribution unit having a power unit module that is capable of providing a predetermined amount of derated power, at least two breaker switches, with each of the at least two breaker switches connected to at least one power socket; securing the power distribution unit to the electronic equipment mounting rack at the specific unit locations on the electronic equipment mounting rack to supply the power requirements to the rack mounted equipment modules at the specific unit locations that have been calculated for the rack mounted equipment modules so that an adequate amount of power is supplied at the specific unit locations in the electronic equipment mounting rack, the specific unit locations being calculated to be proximate to the rack mounted equipment modules to minimize costs associated with power cords and breakers that supply power from the power distribution unit to the rack mounted equipment modules while not supplying power to other unit locations in the electronic equipment mounting rack that do not require power.

An embodiment of the present invention may further comprise a power distribution system for providing power to rack mounted equipment modules comprising: power distribution units having a length of approximately eight rack units, the power distribution units having a power input module that is capable of providing a predetermined amount of derated power, at least two breaker switches, with each breaker switch connected to a plurality of power sockets; an electronic equipment mounting rack having the power distribution units mounted at specific rack unit locations so that an adequate amount of power is supplied at the specific rack unit locations to meet power requirements of the rack mounted equipment modules that are mounted in the electronic equipment mounting rack at the specific rack unit locations.

An embodiment of the present invention may further comprise a method of providing power to rack mounted equipment modules in an electronic equipment mounting rack having a predetermined height comprising: constructing a power distribution unit that has a length that substantially spans the predetermined height of the electronic equipment mounting rack, the power distribution units having a plurality of sets of sockets disposed along the length of the power distribution unit; connecting a first power entry module to the power distribution unit, the first power entry module having at least two switch breakers that supply at least a first interconnecting circuit and a second interconnecting circuit; connecting the first interconnecting circuit to at least one socket in a first set and a second set of the plurality of sets of sockets to supply power from the first interconnecting circuit to a first plurality of rack locations on the electronic equipment mounting rack; connecting the second interconnecting circuit to at least one socket in the first set and the second set of the plurality of sets of sockets to supply power from the second interconnecting circuit to the first plurality of rack locations on the electronic equipment mounting rack; calculating power requirements in the electronic equipment mounting rack based upon calculated power requirements of the rack mounted equipment modules; connecting additional power entry modules to the power distribution unit whenever additional power is required to meet the calculated power requirements of the rack mounted equipment modules, the additional power entry modules having additional switch breakers that supply additional interconnecting circuits; connecting the additional interconnecting circuits to additional sets of the plurality of sets of sockets so that each additional interconnecting circuit is connected to at least two sets of sockets of the additional sets of sockets to supply additional power from each additional interconnecting circuit to at least two rack locations in accordance with the calculated power requirements.

An embodiment of the present invention may further comprise a power distribution system for providing power to rack mounted equipment modules having predetermined power requirements in an electronic equipment mounting rack comprising: an electronic equipment mounting rack that has a predetermined height; a power distribution unit that has a length that substantially spans the predetermined height of the electronic equipment mounting rack, the power distribution unit having a plurality of sets of sockets disposed along the length of the power distribution unit; a first power entry module that is connected to the power distribution unit, the first power entry module having at least two switch breakers that supply at least a first interconnecting circuit and a second interconnecting circuit; a plurality of first sockets in a first set of the plurality of sets of sockets that are connected to both the first interconnecting circuit and the second interconnecting circuit, the first set of sockets disposed in the power distribution unit to supply power to a first rack location in the electronic equipment mounting rack; a plurality of second sockets in a second set of the plurality of sets of sockets that are connected to both the first interconnecting circuit and the second interconnecting circuit, the second set of sockets disposed to supply power to a second rack location in the electronic equipment mounting rack; additional power entry modules that are connected to the power distribution unit whenever additional power is required to meet the predetermined power requirements of the rack mounted equipment modules, the additional power entry modules having additional switch breakers that provide additional interconnecting circuits that are each connected to at least two additional sets of sockets of the plurality of sets of sockets so that each of the additional interconnecting circuits supplies power to at least two additional rack locations in accordance with the predetermined power requirements of the rack mounted equipment modules.

DETAILED DESCRIPTION OF THE PREFERRED EMBODIMENTS

Figure 1:
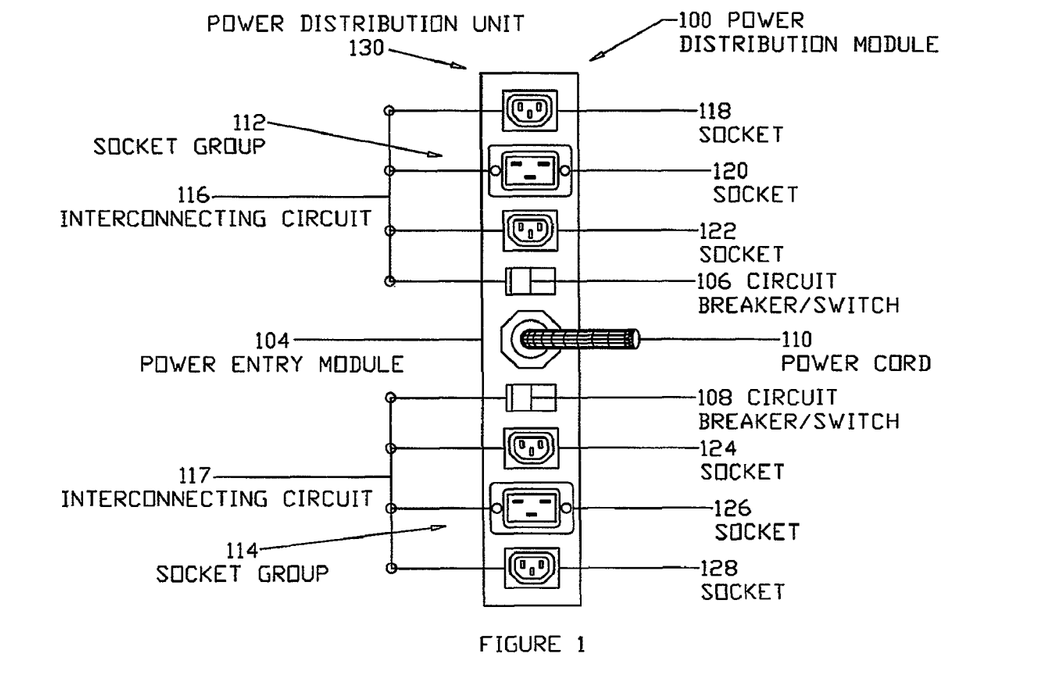
FIG. 1 is a schematic illustration of an embodiment of a power distribution module.

FIG. 1 is a schematic illustration of a power distribution module 100. Power distribution module 100 includes a housing 102 and a power entry module 104. Housing 102 houses a socket group 112 and a socket group 114. The housing 102, socket group 112 and socket group 114, together with the interconnecting circuits 116, 117 comprise a power distribution unit 130. Socket group 112, in one embodiment, may comprise three sockets, i.e., sockets 118, 120, 122. Sockets 118, 122, may comprise NEMA type C14 sockets, while socket 120 may comprise a NEMA type C20 socket. Socket group 114 includes sockets 124, 126, 128. Sockets 124, 128 may comprise NEMA C14 sockets, while socket 126 may comprise a NEMA C20 socket. Alternatively, IEC compatible sockets can also be used for sockets 118-128, such as IEC 60309 compatible sockets. NEMA C20 sockets are capable of providing higher currents than NEMA C14 sockets. In that regard, one NEMA C20 socket is included in each of the socket groups 112, 114 to provide higher power capacity sockets at spatially separated locations in the power distribution module 100.

As illustrated in FIG. 1, power entry module 104 is connected to the power distribution unit 130 to provide power to the power distribution unit. Again, the power distribution unit 130 includes the housing 102, socket groups 112, 114, and interconnecting circuits 116, 117. Power entry module 104 includes circuit breaker/switches 106, 108 that perform the function of both an electrical breaker, as well as a manual switch, to activate and de-activate the socket groups 112, 114. The circuit breaker/switches disclosed herein may comprise UL Listed Breakers that have specified safety requirements. Power entry module 104 also includes a power cord 110 that supplies power to the power entry module 104.

Figure 6:
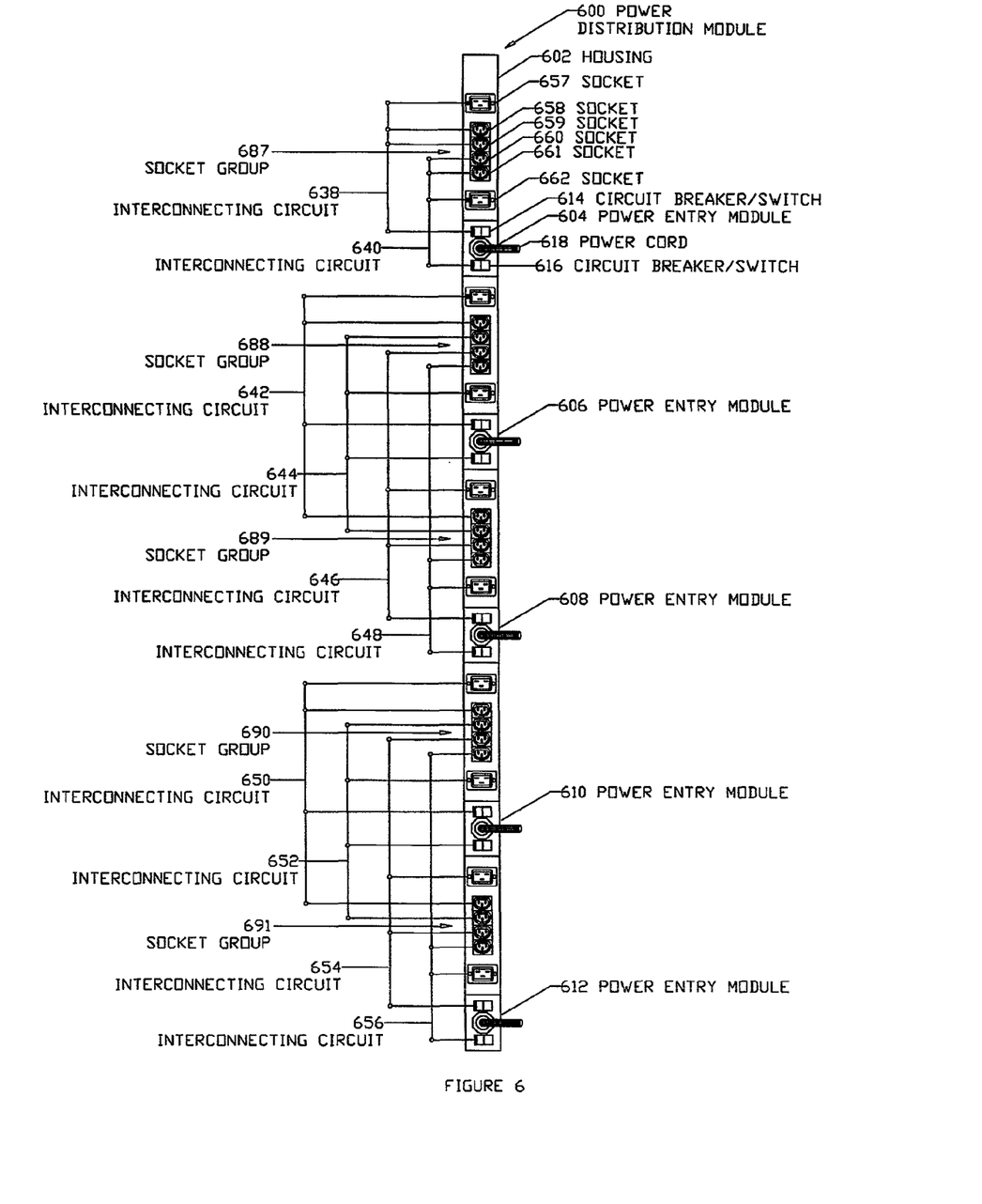
FIG. 6 is a schematic illustration of another embodiment of a power distribution module.
Figure 7:
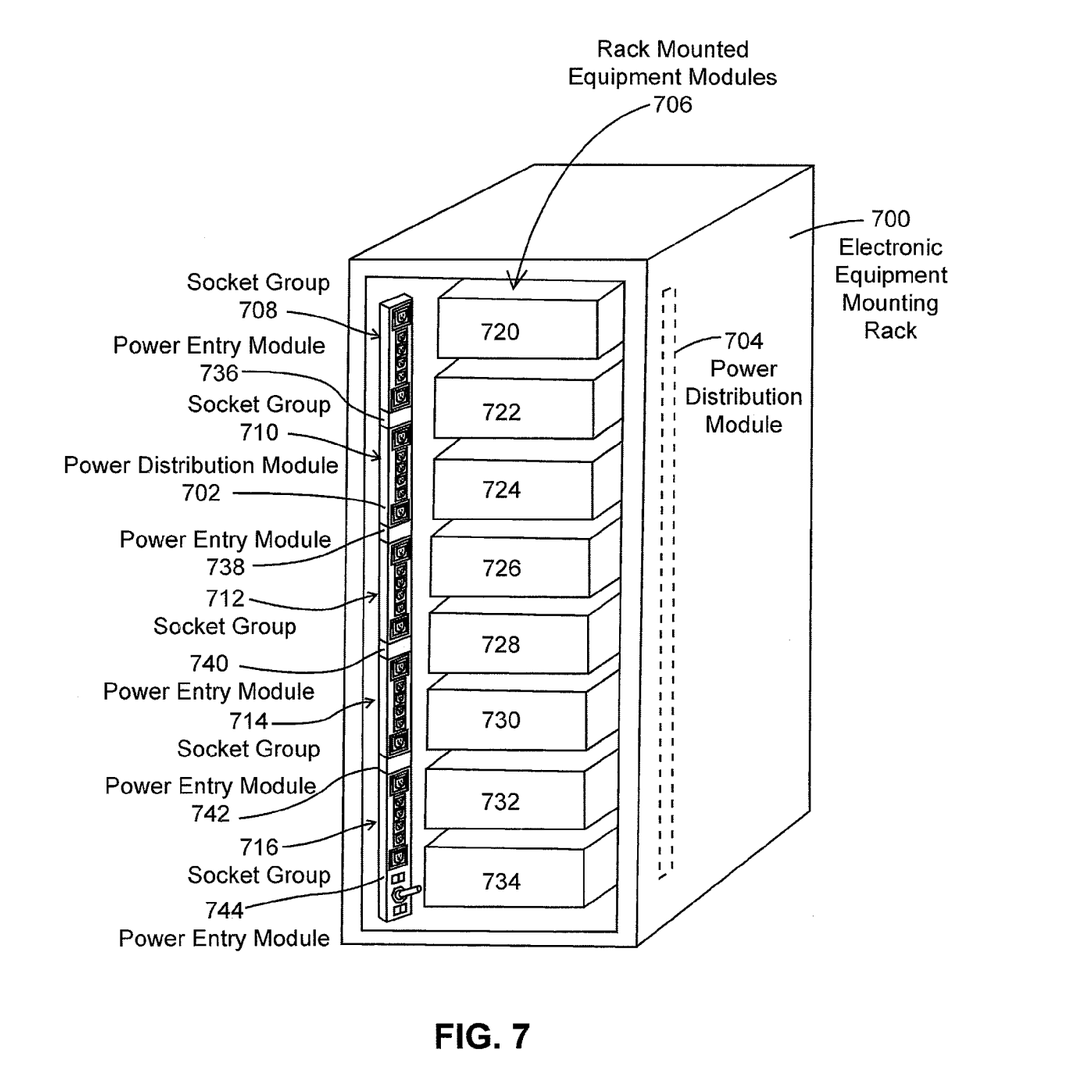
FIG. 7 is a schematic illustration of an embodiment of a power distribution module disposed in a rack.

Power distribution modules 100 are adapted to be mounted in electronic equipment mounting racks, such as electronic equipment mounting rack 700, illustrated in FIG. 7. Rack mounted equipment modules, that are mounted in the electronic equipment mounting racks, have demonstrated increasing power density requirements over the past few years. For example, storage densities, as well as associated power requirements for RAID storage modules, have increased significantly. As such, large amounts of power are ideally distributed in areas where needed in the electronic equipment mounting racks in an effective and inexpensive manner. In that regard, since power cords and circuit breaker/switches comprise a large portion of the cost of delivering power to rack mounted equipment modules, it is desirable to meet the power requirements of the rack mounted equipment modules in an inexpensive and effective manner. As such, providing power outlets at locations that are proximate to the rack mounted equipment modules decreases the amount of wiring that exists in the rack and provides an organized and easily discernible power delivery system that is less expensive and more reliable than alternative systems. In the past, users of power distribution modules have been forced to either purchase expensive power distribution modules to cover maximum power requirements, or otherwise rely on multiple different types of power distribution modules that require separate design, release, support, inventory management and an inventory of repair parts. Both of these solutions are expensive and difficult to implement. The use of a single design power distribution module, such as the power distribution module 100, illustrated in FIG. 1, which has a height of approximately eight rack units, is an advantageous alternative to other solutions, since the power distribution module 100 comprises a single design and can be placed in an electronic equipment mounting rack at a location that is proximate to the rack mounted equipment modules that require power. Further, the placement of the socket groups 112, 114, at the outer ends of the power distribution module 100, results in the socket groups 112, 114 being disposed adjacent to the rack mounted equipment modules. This is a result of the fact that most rack mounted equipment modules occupy a vertical space of four or five rack units. Since the power distribution module 100 is eight rack units long, the socket groups 112, 114 can be placed proximate to the rack mounted equipment modules. This is more fully disclosed with respect to the description of FIG. 6 below.

Figure 2:
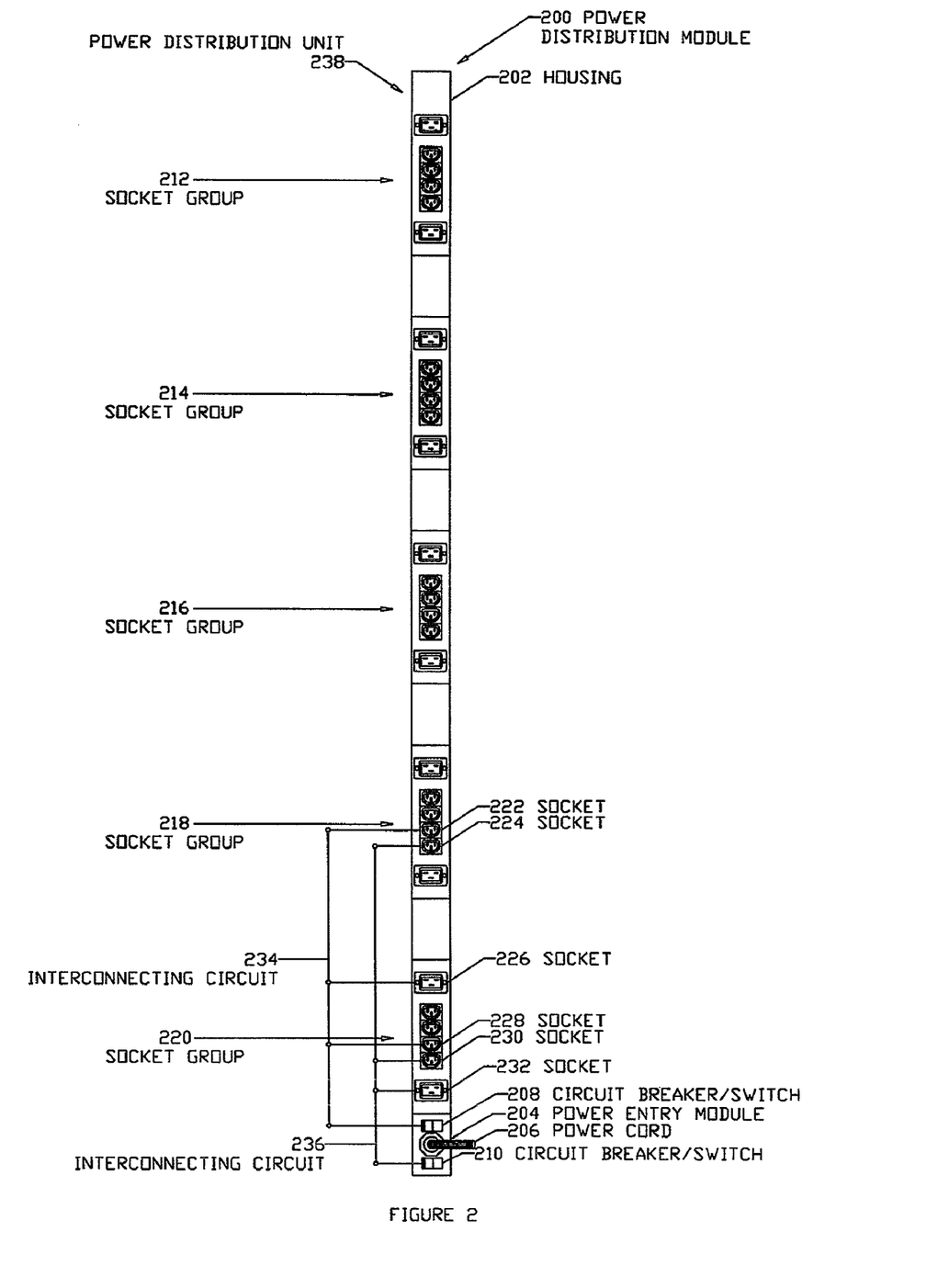
FIG. 2 is a schematic illustration of another embodiment of a power distribution module.
Figure 3:
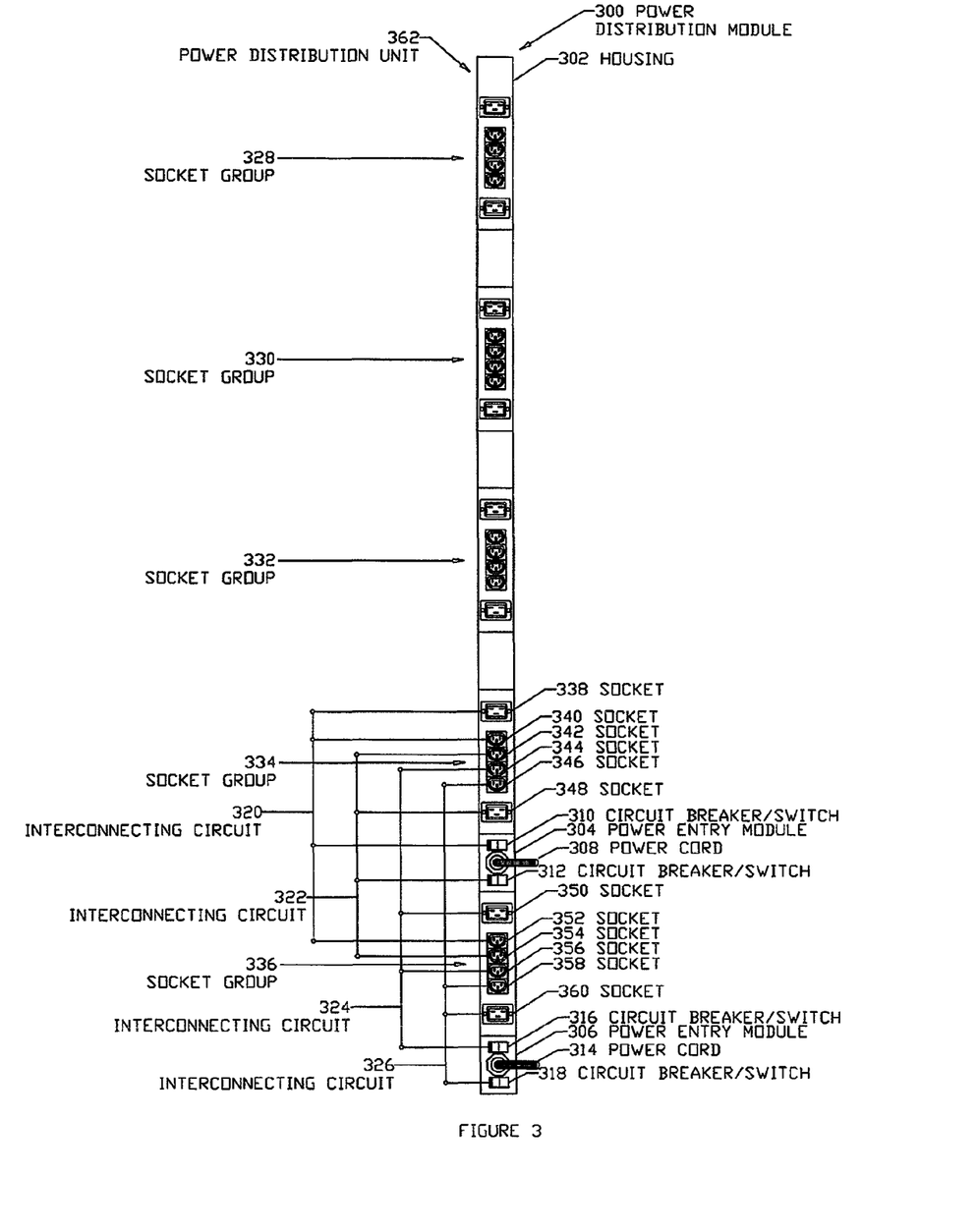
FIG. 3 is a schematic illustration of another embodiment of a power distribution module.
Figure 4:
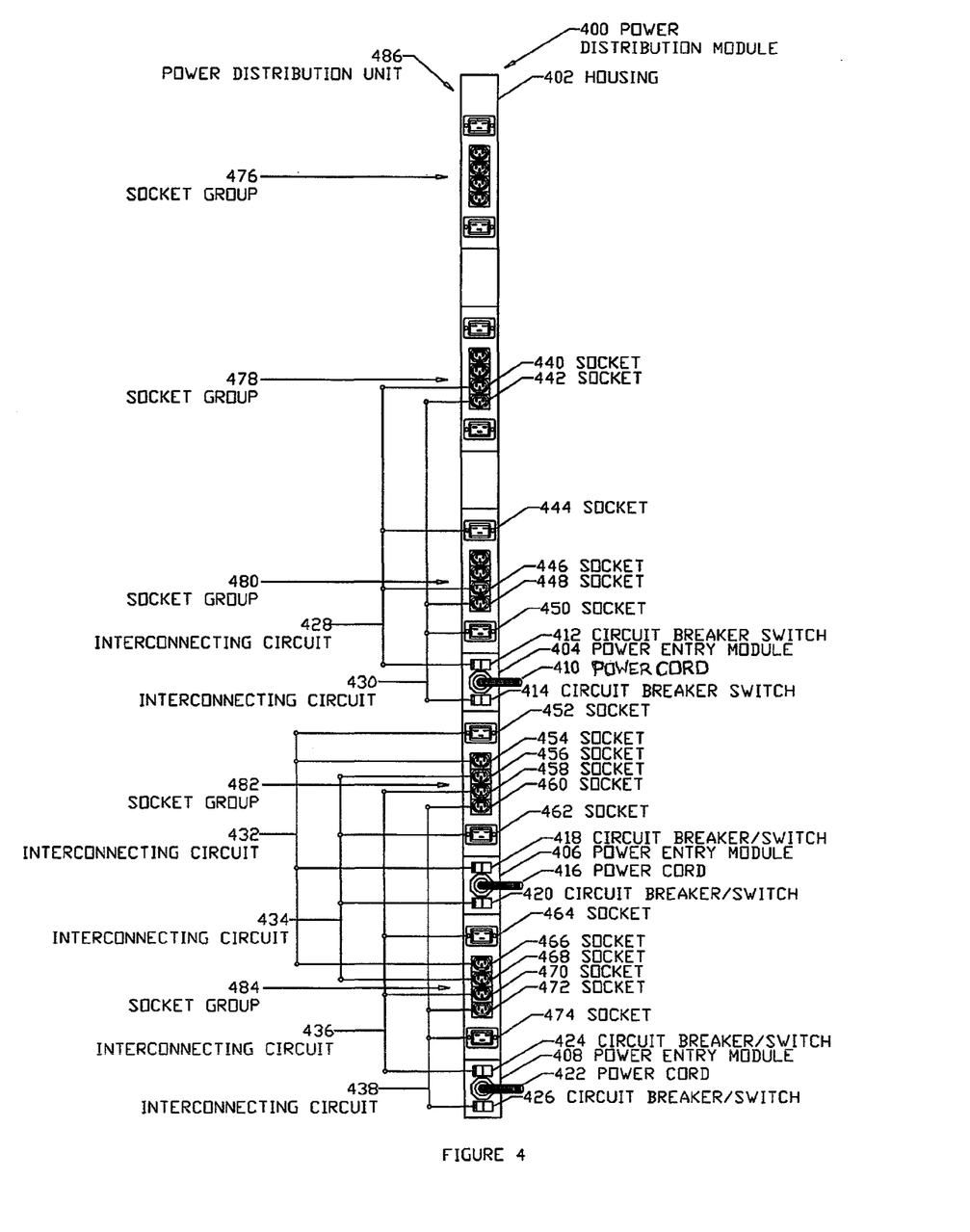
FIG. 4 is a schematic illustration of another embodiment of a power distribution module.
Figure 5:
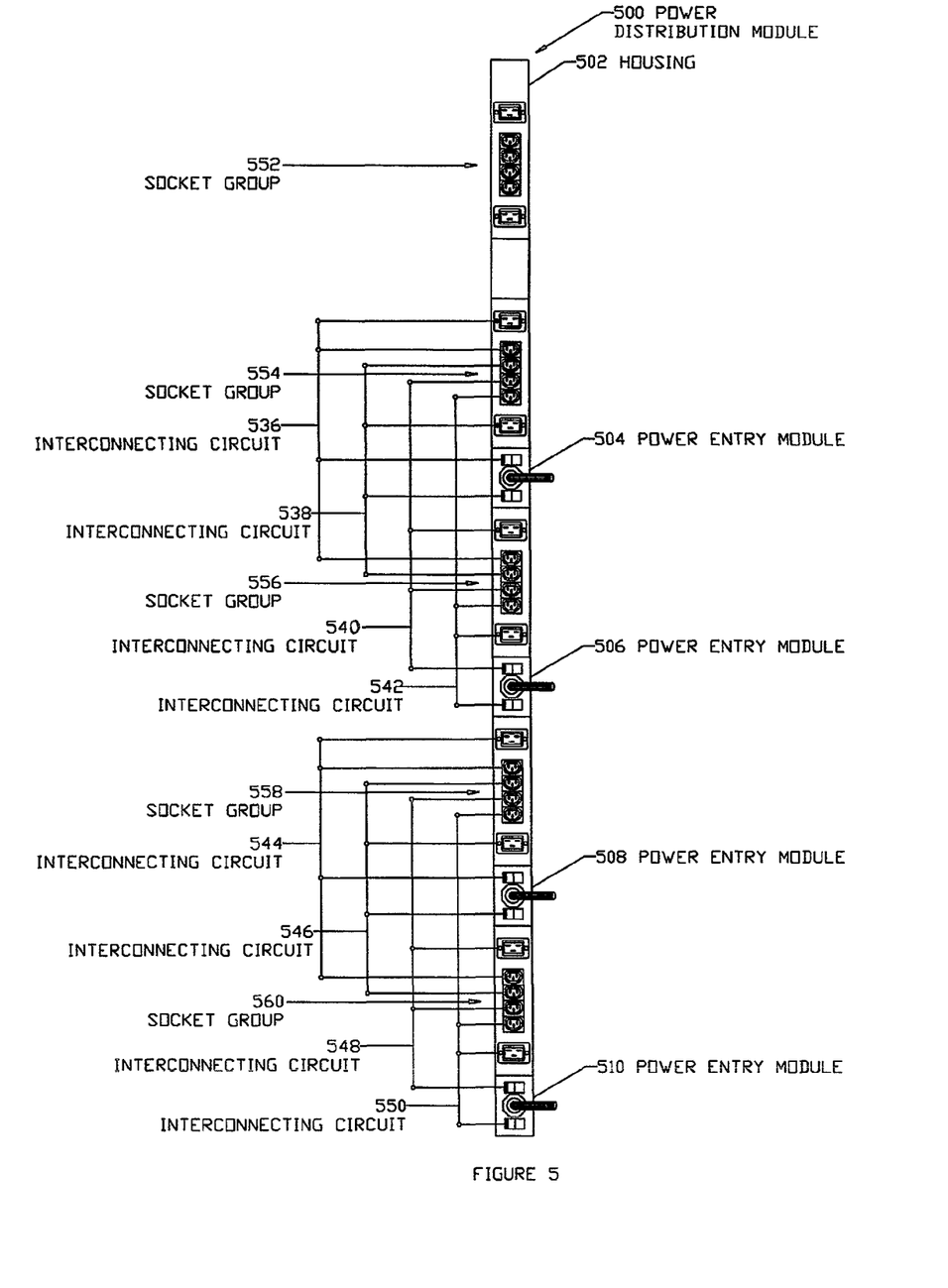
FIG. 5 is a schematic illustration of another embodiment of a power distribution module.

FIGS. 2 through 6 illustrate various versions of an additional embodiment of a power distribution module. FIG. 2 is a schematic illustration of a power distribution module 200. As illustrated in FIG. 2, the power distribution module 200 includes a housing 202 and a power entry module 204. A plurality of socket groups 212, 214, 216, 218, 220 is mounted in the housing 202. The housing 202, socket groups 212-220 and interconnecting circuits 234, 236 form the power distribution unit 238. The power distribution unit 238 has a length that spans substantially the entire height of the cavity of the electronic equipment mounting rack 500, as illustrated in FIG. 5, which is about 40 rack units. The socket groups 212-220, as shown in FIG. 2, are substantially evenly dispersed throughout the length of the power distribution unit 238, so that power can be delivered to rack mounted equipment modules disposed throughout the height of the electronic equipment mounting rack 700, as disclosed in more detail below with respect to FIG. 7. In this manner, the socket groups can provide adequate power in close proximity to the rack mounted equipment modules 706 (FIG. 7).

As also illustrated in FIG. 2, the power entry module 204 includes a circuit breaker/switch 208 that is coupled to interconnecting circuit 234. Circuit breaker/switch 210 is connected to interconnecting circuit 236. Interconnecting circuit 234 is coupled to sockets 224 and 230, 232 in socket groups 218, 220, respectively. Interconnecting circuit 236 is connected to sockets 224 and 230, 232, which are disposed in socket groups 218, 220, respectively. Since socket groups 218, 220 are disposed adjacent to each other, activation of sockets 222-232 on separate interconnecting circuits 234, 236 provides separate sources of power on separate circuits in a lower portion of the electronic equipment mounting rack. Socket groups 212, 214 and 216 are not connected to power entry modules and therefore are not activated, in the embodiment illustrated in FIG. 2.

FIG. 3 discloses a power distribution module 300 having a housing 302 and two power entry modules 304, 306 that are supplied power from power cords 308, 314, respectively. Housing 302 has a length that spans substantially the entire height of the interior portion of the electronic equipment mounting rack, as illustrated in FIG. 7, which is approximately 40 rack units. A plurality of socket groups, such as socket groups 328, 330, 332, 334, 336 are disposed along the length of the housing 302. The socket groups 328-336, together with the housing 302 and interconnecting circuits 320, 322, 324, 326, comprise the power distribution unit 362. The power entry modules 304, 306 are connected to the power distribution unit 358 to form the power distribution module 300.

As illustrated in FIG. 3, circuit breaker/switch 310 of power entry module 304 is connected to interconnecting circuit 320 that connects sockets 338, 340, 352. Sockets 338, 340 are located in socket group 334, while socket 352 is located in socket group 336. Circuit breaker/switch 312 is connected to interconnecting circuit 322. Sockets 342, 348, 354 are connected to interconnecting circuit 322. Sockets 342, 348 are disposed in socket group 334, while socket 354 is disposed in socket group 336. Socket group 334 is disposed adjacent to socket group 336. Hence, interconnecting circuits 320, 322 each provide power to two distinct locations in the power distribution module 300 to distribute power evenly using two separate circuits.

Similarly, power distribution module 306 is connected to interconnecting circuit 324. Interconnecting circuit 324 is connected to socket 344 that is disposed in socket group 334. In addition, interconnecting circuit 324 is connected to sockets 350, 352, 356, which are disposed in socket group 336. Circuit breaker/switch 318 is connected to socket 346 and socket group 334, and to sockets 358, 360 that are disposed in socket group 336. Hence, the two different interconnecting circuits 324, 326 distribute power evenly between socket groups 334, 336. In that regard, sockets 338, 348, 350 and 360 are C20 sockets that are capable of delivering higher power than the C14 sockets, which comprise sockets 340-346 and 352-358. The C20 sockets are also evenly distributed in the socket groups 334, 336, which further provides an even power distribution in the lower portion of the power distribution module 300. Socket groups 328, 330, 332 are not connected in the power distribution unit 362. In this manner, substantial savings can be realized in constructing the power distribution module 300 for distribution of power to the lower end of an electronic equipment mounting rack, when rack mounted equipment modules are only disposed at the lower end of an electronic equipment mounting rack.

FIG. 4 is an illustration of another embodiment of a power distribution module 400 that distributes power to lower and middle portions of an electronic equipment mounting rack. In that regard, when designing electronic equipment mounting racks, such as the electronic equipment mounting rack 700, illustrated in FIG. 7, the rack mounted equipment modules 706 are normally first disposed in the lower portions for balance considerations. Hence, the power distribution module 400, illustrated in FIG. 4, is designed for an electronic equipment mounting rack that has rack mounted equipment modules in lower and middle portions of the rack. Since upper portions of the electronic equipment mounting rack are not used, power is not distributed to the upper portions of the power distribution module 400. In this manner, the more expensive power entry modules and power cords are not used in the upper portions of the power distribution module 400.

As illustrated in FIG. 4, power distribution module 400 includes a housing 402 and power entry modules 404, 406, 408. Interconnecting circuits 432, 434, 436, 438 are connected to circuit breaker/switches 418, 420, 424, 426, respectively, to distribute power evenly between socket groups 482, 484. Power cord 416 provides power to power entry module 406, while power cord 422 provides power to power entry module 408. Sockets 452-462 are disposed in socket group 482, while sockets 464-474 are disposed in socket group 484. Power entry module 404 provides power via power cord 410 to only a portion of the sockets in socket groups 478, 480. For example, circuit breaker/switch 412 is connected to interconnecting circuit 428, which provides power to socket 440 in socket group 478, and sockets 444, 446 in socket group 480. Circuit breaker/switch 414 is connected to interconnecting circuit 430, which provides power to socket 442 in socket group 478 and sockets 448, 450 in socket group 480. In this manner, power is distributed between socket groups 478, 480 by the two separate interconnecting circuits 428, 430. Socket group 476 in the power distribution module 486 is not connected to a power entry module.

FIG. 5 is a schematic illustration of another embodiment of a power distribution module 500. As illustrated in FIG. 5, the power distribution module 500 includes a housing 502 and power entry modules 504, 506, 508, 510. Power entry modules 508, 510 provide power to interconnecting circuits 544, 546, 548, 550, which distribute power to the socket groups 558, 560 in the manner disclosed in FIGS. 3 and 4.

Similarly, power entry modules 504, 506 utilize interconnecting circuits 536, 538, 540, 542 to distribute power to socket groups 554, 556. The power is distributed to the sockets in socket groups 554, 556 in the same manner as power is distributed to socket groups 558, 560. Socket group 552 is not connected to a power entry module, so that sockets in socket group 552 are not powered. The power distribution module 500, illustrated in FIG. 5, is for use with an electronic equipment mounting rack that has rack mounted equipment modules in lower, middle and upper middle portions of the electronic equipment mounting rack.

FIG. 6 illustrates another embodiment of a power distribution module 600. As illustrated in FIG. 6, the power distribution module 600 includes a housing 602 and power entry modules 604, 606, 608, 610, 612. Power entry modules 610, 612 substantially evenly distribute power between socket groups 690, 691 utilizing interconnecting circuit 650, 652, 654, 656. Similarly, power entry modules 606, 608 substantially evenly distribute power between socket groups 688, 689 utilizing interconnecting circuits 642, 644, 646, 648.

As also illustrated in FIG. 6, power entry module 604 has a circuit breaker/switch 614 which is connected to interconnecting circuit 638. Interconnecting circuit 638 is connected to sockets 657, 658, 659. Power entry module 604 also includes a circuit breaker/switch 616 that is connected to interconnecting circuit 640. Interconnecting circuit 640 connects power to sockets 660, 661 and 662. In this manner, the two interconnecting circuits 638, 640 distribute power throughout socket group 687, which is disposed in the upper portion of the power distribution module 600.

FIG. 7 is schematic illustration of an electronic equipment mounting rack 700. As illustrated in FIG. 7, the plurality of rack mounted equipment modules 706 are mounted in the electronic equipment mounting rack 700. Power distribution modules 702, 704 are disposed on the interior side walls or a back portion of the electronic equipment mounting rack 700 to supply power to the rack mounted equipment modules 706. The power distribution modules, such as power distribution module 702, has a plurality of socket groups, including socket groups 708, 710, 712, 714, 716. Power is supplied to the power distribution module 702 by power entry modules 736-744. Circuit breaker/switches are provided on each of the power entry modules 736-744 and provide power to the socket groups 708-744. As illustrated in FIG. 7, socket group 708 is disposed along a side wall proximate to rack mounted equipment modules 720, 722. Rack mounted equipment modules 720, 722 may obtain power from socket group 708. Similarly, rack mounted equipment module 724 is located in close proximity to socket group 710. Rack mounted equipment module 724 may obtain power from socket group 710. Rack mounted equipment modules 726, 728 are located proximate to socket group 712. Rack mounted equipment modules 726, 728 may receive power from socket group 712. Rack mounted equipment modules 730, 732 are located proximate to socket group 714. Rack mounted equipment modules 730, 732 may receive power from socket group 714. Rack mounted equipment module 734 is adjacent socket group 717 and receives power from socket group 716. The circuit breaker/switches provide two separate circuits for supplying power to sockets in socket groups 708-714. If the sockets in socket groups 708-714 are incapable of providing sufficient power to the rack mounted equipment modules 706, an additional power distribution module 704 can be provided on the other side wall of the electronic equipment mounting rack 700 to provide sufficient power. The power distribution modules 702, 704 can also provide sources of redundant power. Power distribution modules 702, 704 are constructed so that they can be mounted on either side of the electronic equipment mounting rack 700 for both simplicity and cost reduction, since the same part can be mass produced for use on either side. In this fashion, identical versions of the power distribution modules can be mounted on each side of the electronic equipment mounting rack 700 to provide two separate sources of power that can be separately wired to independent sources of power, which can assist in preventing system failure.

The electronic mounting rack 700 and the rack mounted equipment modules 706, illustrated in FIG. 7, are normally designed and assembled for a particular solution for a customer. For example, rack mounted equipment modules 706 may comprise a series of RAID storage devices and one or more servers. When the electronic equipment mounting rack 700 and the rack mounted equipment modules 706 are designed, the power requirements of the rack mounted equipment modules 706 are determined. At that point, the particular type of power connection can be determined. For example, a C13 power cord and plug may be sufficient to supply power to a rack mounted equipment module 706, so that a C14 socket can be used to supply the current needed. In other situations in which a rack mounted equipment module 706 has greater power requirements, a C19 cable and plug may be required that interface with a C20 socket, which is capable of carrying greater currents. Further, the number of rack mounted equipment modules 706 may not fill the electronic equipment mounting rack 700, as illustrated in FIG. 5. In that case, the rack mounted equipment modules 706 may be designed to be placed in specific rack unit locations in the electronic equipment mounting rack 700, to meet various requirements of the design. For example, the electronic equipment mounting rack 700 is designed so that rack mounted equipment modules 706 are first mounted on lower portions of the electronic equipment mounting rack 700 for purposes of balance and stability. As additional units are added in the design process, the electronic equipment mounting rack is filled from the bottom to the top. In other designs, rack mounted equipment modules 706 may be mounted in other locations and spread apart from other rack mounted equipment modules to provide sufficient air circulation and cooling. Once the specific rack unit locations for the rack mounted equipment modules 706 are determined from the design parameters, a particular version of the power distribution modules 200 (FIG. 2), 300 (FIG. 3), 400 (FIG. 4), 500 (FIG. 5) or 600 (FIG. 6) can be selected to meet the power requirements of the rack mounted equipment modules 706 in accordance with the locations of the rack mounted equipment modules 706 in the electronic equipment mounting rack 700. By having different versions of the same design of the various power distribution modules, a great deal of expense can be eliminated. For example, additional power entry modules, such as power entry module 716, and additional power cords, which constitute the primary cost of the power distribution module 702, do not have to be provided in situations in which the power requirements do not necessitate the expense of a fully wired and fully configured power distribution module. Hence, calculations of power requirements, based upon design parameters of the electronic equipment mounting rack 700, allows the designer to select a power distribution module that meets, but does not substantially exceed, the power requirements of the system.

Figure 8:
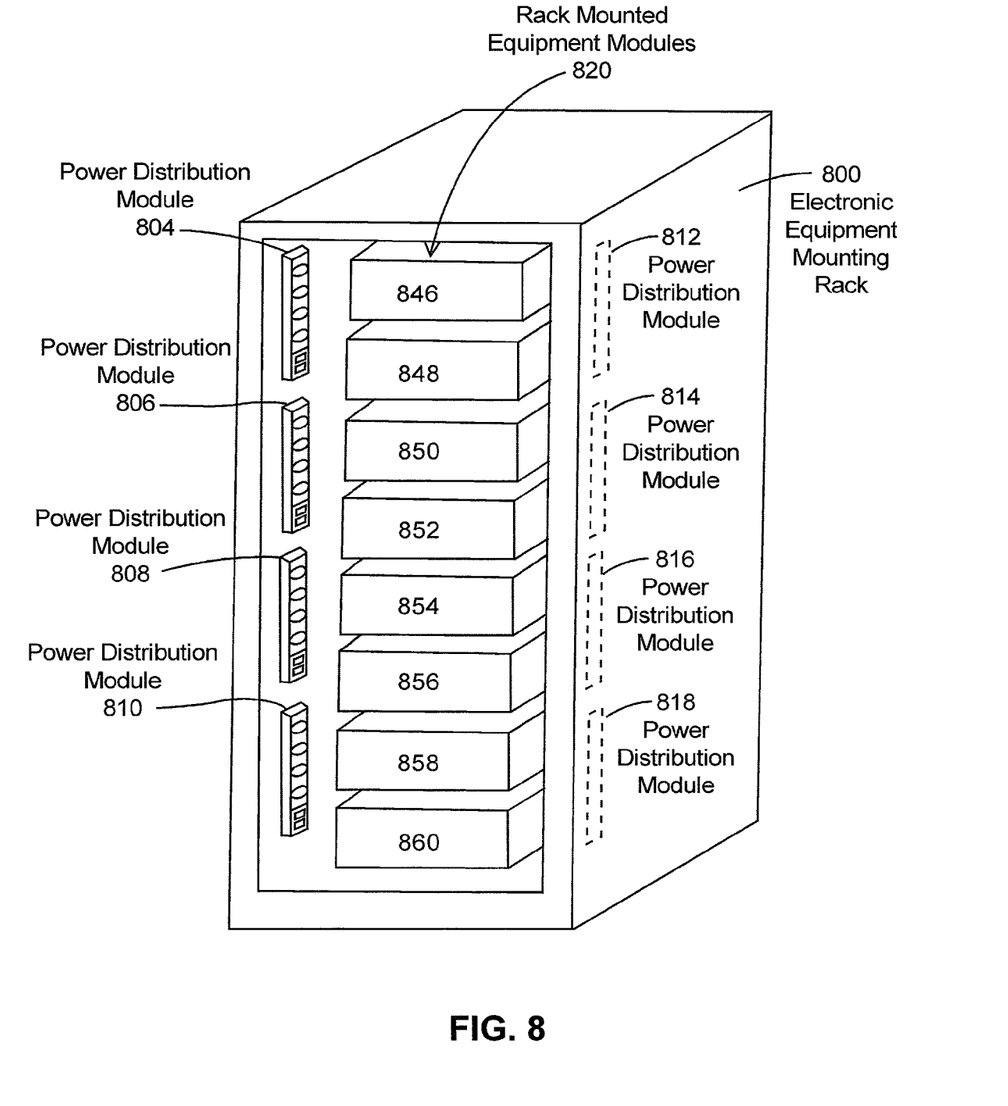
FIG. 8 is a schematic illustration of another embodiment of power distribution modules disposed in a rack.

FIG. 8 is an illustration of another embodiment of an electronic equipment mounting rack 800 having a plurality of rack mounted equipment modules 820. The embodiment illustrated in FIG. 8 utilizes the standard power distribution module 100 that is illustrated in FIG. 1. As illustrated in FIG. 8, a plurality of rack mounted equipment modules 820 is disposed in the electronic equipment mounting rack 800. The number and placement of the rack mounted equipment module 820 is designed by the manufacturer to provide a particular function. For example, rack mounted equipment module 820 may be a series of RAID storage devices and servers that provide a large amount of storage capacity. These rack mounted equipment modules 620 may also have large power requirements. As shown in FIG. 6, a plurality of power distribution modules, such as power distribution modules 804, 806, 808 and 810 are disposed on an interior sidewall or back portion of the electronic equipment mounting rack 800. Also, additional power distribution modules can be provided on an opposite sidewall, such as power distribution module 812, 814, 816 and 818. The power distribution modules 804-818 are constructed so that they can be mounted on either side of the electronic equipment mounting rack, for both simplicity and cost reduction, since the same part can be mass produced for use on either side. In this fashion, identical versions of the power distribution modules can be mounted on both sides of the electronic equipment mounting rack 800 to provide two separate sources of power that can be separately wired to independent sources of power, which assists in preventing system failure. In this manner, a source of redundant power can be provided to the electronic equipment mounting rack 800.

Power distribution modules, illustrated in FIG. 8, such as power distribution module 804-810 and 812-818, are disposed in the electronic equipment mounting rack 800 in accordance with the power requirements of the rack mounted equipment modules 820. If there are less than a full rack full of rack mounted equipment modules 820, the design parameters of the electronic equipment mounting rack 800 will dictate the number and placement of the power distribution modules in the electronic equipment mounting rack 800. In that regard, only the number of power distribution modules that are required to meet the power requirements of the rack mounted equipment module 820 need to be deployed in the electronic equipment mounting rack 800. Further, since the power distribution modules 804-810 and 812-818 have a length of approximately eight rack units, each power distribution module has the ability to supply power to at least two rack mounted equipment modules 820 in close proximity to the rack mounted equipment module 820, which reduces the length of expensive power cords. In a standard 40 unit high electronic equipment mounting rack, up to ten power distribution modules can be deployed.

Figure 9:
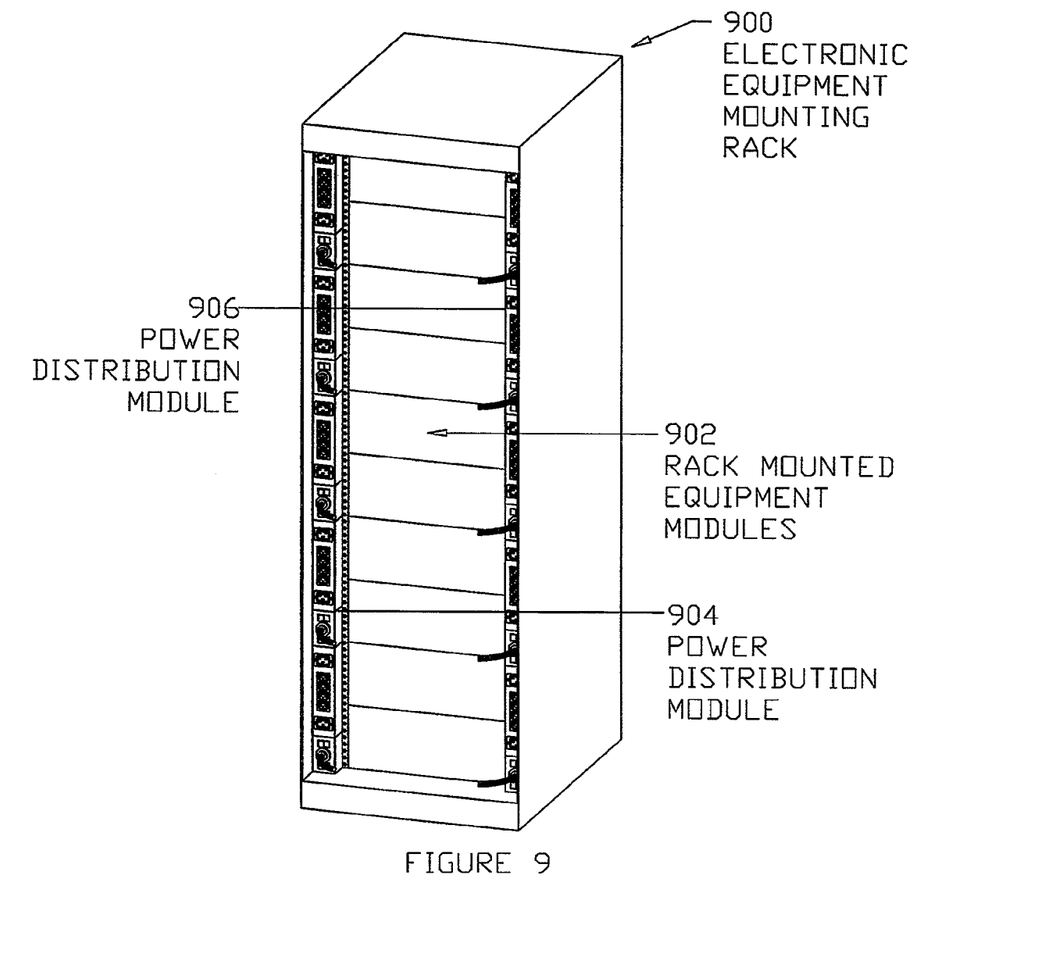
FIG. 9 is a schematic illustration of another embodiment of power distribution modules disposed in a rack.

FIG. 9 is a schematic illustration of another embodiment of an electronic equipment mounting rack 900. As shown in FIG. 9, rack mounted equipment modules 902 are disposed within the electronic equipment mounting rack 900. Power distribution modules 904, 906 are mounted on a back wall, so that the power distribution modules 904, 906 face in a rearward direction.

Figure 10:
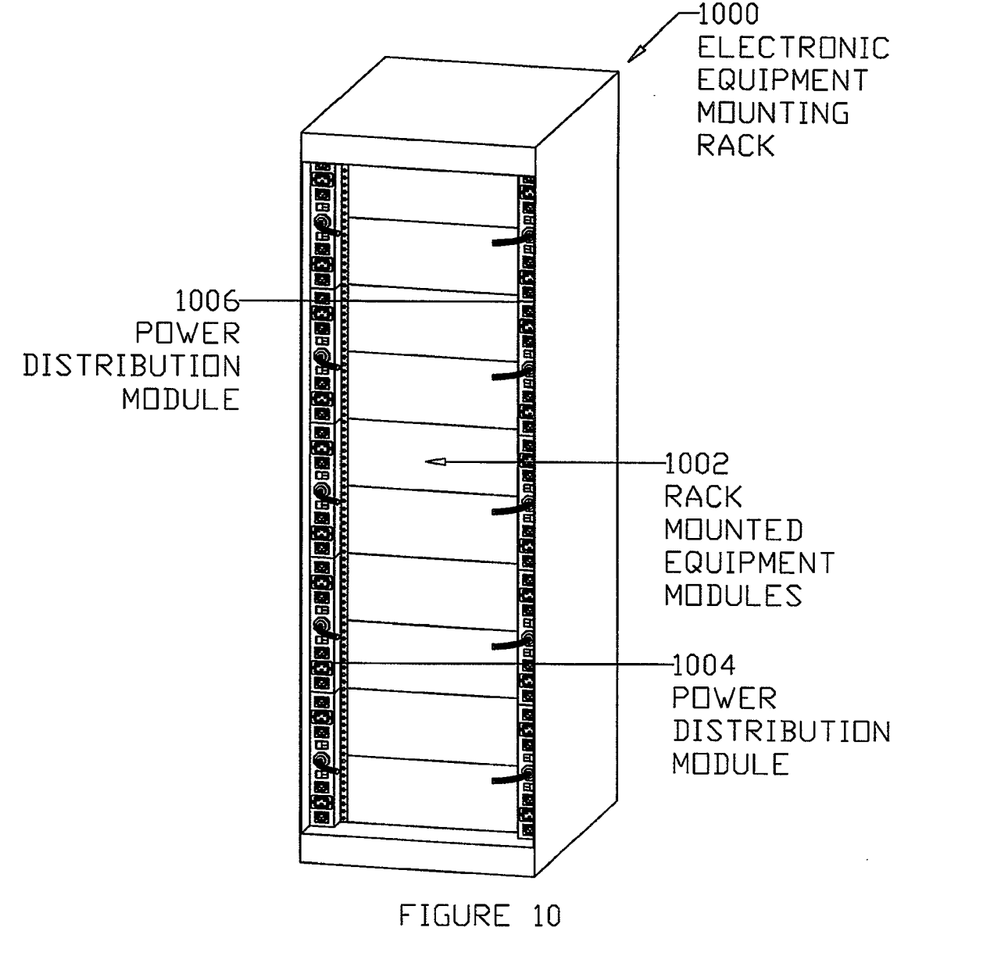
FIG. 10 is a schematic illustration of another embodiment of power distribution modules disposed in a rack.

FIG. 10 is a schematic illustration of another embodiment of an electronic equipment mounting rack 1000. As shown in FIG. 10, rack mounted equipment modules 1002 are disposed within the electronic equipment mounting rack 1000. Power distribution modules 1004, 1006 are mounted on a back wall in the electronic equipment mounting rack 1000 and face in a rearward direction.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of providing power to rack mounted equipment modules in an electronic equipment mounting rack having a height comprising:
    constructing a power distribution unit that has a length that substantially spans said height of said electronic equipment mounting rack, said power distribution unit having a plurality of sets of sockets disposed along said length of said power distribution unit,
        wherein each socket within each set of the plurality of sets of sockets is disposed adjoining another socket within the set; and
        wherein each set of the plurality of sets is disposed and separately from each other set;
    connecting a first power entry module to said power distribution unit, said first power entry module having at least a first switch breaker that supplies a first interconnecting circuit and a second switch breaker that supplies a second interconnecting circuit;
    connecting said first interconnecting circuit to at least one socket in a first set and a second set of said plurality of sets of sockets to supply power from said first interconnecting circuit to a first plurality of rack locations on said electronic equipment mounting rack; and
    connecting said second interconnecting circuit to at least one socket in said first set and said second set of said plurality of sets of sockets to supply power from said second interconnecting circuit to said first plurality of rack locations on said electronic equipment mounting rack.

2. The method of claim 1 wherein said process of constructing a power distribution unit comprises constructing a power distribution unit in which said plurality of sets of sockets comprise both NEMA type C14 and C20 receptacles.

3. The method of claim 1, further comprising:
    calculating power requirements in said electronic equipment mounting rack based upon calculated power requirements of said rack mounted equipment modules;
    connecting additional power entry modules to said power distribution unit based on said calculated power requirements of said rack mounted equipment modules, said additional power entry modules having additional switch breakers that supply additional interconnecting circuits; and
    connecting said additional interconnecting circuits to additional sets of said plurality of sets of sockets so that each additional interconnecting circuit is connected to at least two sets of sockets of said additional sets of sockets to supply additional power from each additional interconnecting circuit to at least two rack locations in accordance with said calculated power requirements.

4. The method of claim 3 wherein said process of connecting additional power entry modules to said power distribution unit comprises connecting said additional power entry modules from a bottom portion to a top portion of said electronic equipment mounting rack as additional rack mounted equipment modules are mounted in said electronic equipment mounting rack from said bottom portion to said top portion.

5. A power distribution system for providing power to rack mounted equipment modules in an electronic equipment mounting rack comprising:
    an electronic equipment mounting rack that has a height;
    a power distribution unit that has a length that substantially spans said height of said electronic equipment mounting rack, said power distribution unit having a plurality of sets of sockets disposed along said length of said power distribution unit,
        wherein each socket within each set of the plurality of sets of sockets is disposed adjoining another socket within the set; and
        wherein each set of the plurality of sets is disposed and separately from each other set;
    a first power entry module that is connected to said power distribution unit, said first power entry module having at least a first switch breaker that supplies a first interconnecting circuit and a second switch breaker that supplies a second interconnecting circuit;
    a plurality of first sockets in a first set of said plurality of sets of sockets that are connected to both said first interconnecting circuit and said second interconnecting circuit, said first set of sockets disposed in said power distribution unit to supply power to a first rack location in said electronic equipment mounting rack; and
    a plurality of second sockets in a second set of said plurality of sets of sockets that are connected to both said first interconnecting circuit and said second interconnecting circuit, said second set of sockets disposed to supply power to a second rack location in said electronic equipment mounting rack.

6. The power distribution system of claim 5 wherein said first set and said second set of said plurality of sets of sockets comprise both NEMA type C14 and C20 sockets.

7. The power distribution system of claim 5, wherein the first power entry module is disposed at a bottom end of the power distribution unit.

8. A power distribution unit comprising:
- a first group of power sockets located in a first region, wherein each power socket of the first group is disposed adjoining another power socket within the first group;
- a second group of power sockets located in a second region, wherein each power socket of the second group is disposed adjoining another power socket within the second group, and
  - wherein the first group of power sockets does not adjoin the second group of power sockets;
- a power entry module comprising a first switch breaker electrically connected to a first interconnecting circuit and a second switch breaker electrically connected to a second interconnecting circuit;
- a first socket of the first group of power sockets electrically connected to the first interconnecting circuit;
- a second socket of the first group of power sockets electrically connected to the second interconnecting circuit;
- a third socket of the second group of power sockets electrically connected to the first interconnecting circuit; and
- a fourth socket of the second group of power sockets electrically connected to the second interconnecting circuit.

9. The power distribution unit of claim 8 further comprising:
- a third and fourth interconnecting circuit;
- a fifth socket of the first group of power sockets electrically connected to the third interconnecting circuit;
- a sixth socket of the first group of power sockets electrically connected to the fourth interconnecting circuit;
- a seventh socket of the second group of power sockets electrically connected to the third interconnecting circuit; and
- an eighth socket of the second group of power sockets electrically connected to the fourth interconnecting circuit;
- wherein the power distribution unit is configured to removably receive a second power entry module comprising a third switch breaker and a fourth switch breaker; and
- wherein receiving the second power entry module comprises electrically coupling the third switch breaker to the third interconnecting circuit and electrically coupling the fourth switch breaker to the fourth interconnecting circuit.

10. The power distribution unit of claim 8,
- wherein the first region corresponds to a first rack region for installing rack mounted equipment modules in an electronic equipment mounting rack; and
- wherein the second region corresponds to a second rack region for installing other rack mounted equipment modules in an electronic equipment mounting rack.

11. The power distribution unit of claim 8, wherein the first power entry module is disposed at a bottom end of the power distribution unit.

* * * * *